United States Patent
Nakai

(10) Patent No.: US 9,874,592 B2
(45) Date of Patent: Jan. 23, 2018

(54) ABNORMALITY DETECTION CIRCUIT FOR POWER STORAGE DEVICE, AND POWER STORAGE DEVICE INCLUDING SAME

(71) Applicant: TOSHIBA MITSUBISHI-ELECTRIC INDUSTRIAL SYSTEMS CORPORATION, Chuo-ku (JP)

(72) Inventor: Yasuhiro Nakai, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 150 days.

(21) Appl. No.: 14/783,589

(22) PCT Filed: Apr. 12, 2013

(86) PCT No.: PCT/JP2013/061057
§ 371 (c)(1),
(2) Date: Oct. 9, 2015

(87) PCT Pub. No.: WO2014/167710
PCT Pub. Date: Oct. 16, 2014

(65) Prior Publication Data
US 2016/0061874 A1 Mar. 3, 2016

(51) Int. Cl.
*G01R 31/02* (2006.01)
*H01M 10/42* (2006.01)
(Continued)

(52) U.S. Cl.
CPC ......... *G01R 31/025* (2013.01); *G01R 31/028* (2013.01); *G01R 31/3606* (2013.01);
(Continued)

(58) Field of Classification Search
CPC .............. G01R 31/3658; G01R 31/362; G01R 31/3606; G01R 31/3624; G01R 31/3679;
(Continued)

(56) References Cited

U.S. PATENT DOCUMENTS

| 6,014,012 A * | 1/2000 | Murao ................. G01R 31/362 320/116 |
| 2005/0231175 A1* | 10/2005 | Furukawa ........ G01R 19/16542 323/211 |
| 2014/0368206 A1* | 12/2014 | Aoshima ............ G01R 31/3679 324/426 |

FOREIGN PATENT DOCUMENTS

| JP | 7-146321 A | 6/1995 |
| JP | 2002-159135 A | 5/2002 |
| JP | 2011-130610 A | 6/2011 |

OTHER PUBLICATIONS

International Search Report dated May 28, 2013 in PCT/JP2013/061057 filed Apr. 12, 2013.
(Continued)

*Primary Examiner* — Drew A Dunn
*Assistant Examiner* — Sailesh Thapa
(74) *Attorney, Agent, or Firm* — Oblon, McClelland, Maier & Neustadt, L.L.P.

(57) ABSTRACT

An abnormality detection circuit detects an abnormality in a power storage device. A positive electrode terminal and a negative electrode terminal respectively receive a positive electrical potential and a negative electrical potential from a converter. A power storage module includes plural cells connected in series between the positive electrode terminal and the negative electrode terminal. The abnormality detection circuit includes a voltage detection circuit and a control circuit. The voltage detection circuit detects an electrical potential of an intermediate node located at an intermediate position between the positive electrode terminal and the negative electrode terminal on a basis of a ground potential. The control circuit determines an abnormality of the power storage module based on a change in an intermediate ground potential from voltage detection circuit from the ground potential.

9 Claims, 11 Drawing Sheets

(51) Int. Cl.
*G01R 31/36* (2006.01)
*H02J 9/06* (2006.01)

(52) U.S. Cl.
CPC .... *G01R 31/3679* (2013.01); *H01M 10/4285* (2013.01); *G01R 31/362* (2013.01); *H02J 9/062* (2013.01)

(58) Field of Classification Search
CPC .......... G01R 19/16542; G01R 31/3651; G01N 31/02; G01N 27/42
USPC .................................................. 324/427–436
See application file for complete search history.

(56) References Cited

OTHER PUBLICATIONS

Office Action dated Aug. 2, 2016 in Japanese Patent Application No. 2015-511049 (with English language translation).
Korean Office Action dated Sep. 12, 2016 in Patent Application No. 10-2015-7030622 (with English translation).
Combined Chinese Office Action and Search Report dated May 17, 2017 in Chinese Patent Application No. 201380075493.9 (with English translation of the Office Action and English translation of Category of Cited Documents).

* cited by examiner

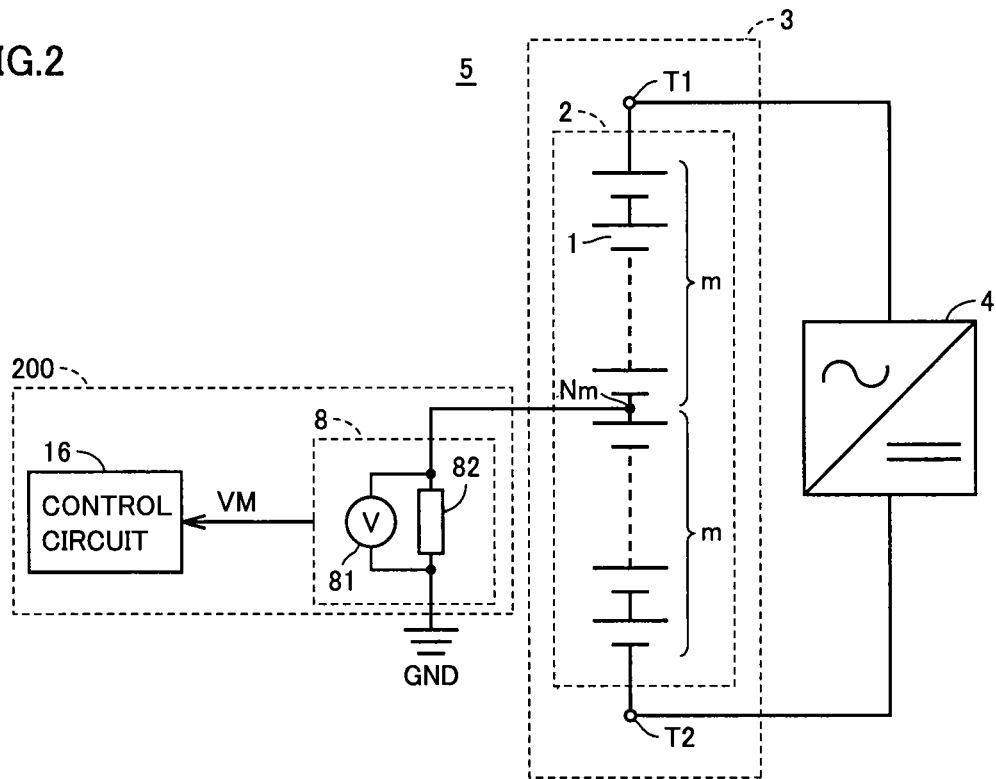
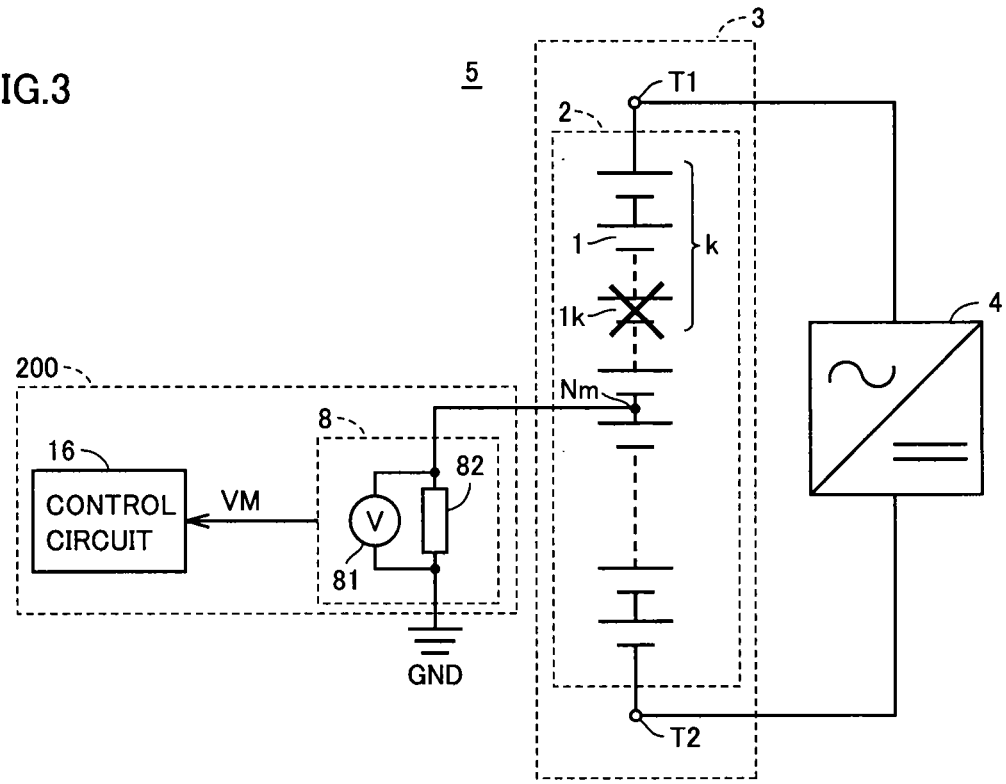

ABNORMALITY DETECTION CIRCUIT FOR POWER STORAGE DEVICE, AND POWER STORAGE DEVICE INCLUDING SAME

TECHNICAL FIELD

The present invention relates to an abnormality detection circuit for a power storage device, and a power storage device including the same.

BACKGROUND ART

For example, an uninterruptable power supply device includes a storage battery or a capacitor as a power storage unit. A rated voltage per cell of the storage battery or capacitor is, for example, about 2V to 3V. A large number of cells are connected in series, so that a charging and discharging voltage of the power storage unit is adjusted. The plurality of cells connected in series are also referred to as a power storage module. A plurality of power storage modules are connected in parallel to secure a required capacity of the power storage unit.

Occurrence of an abnormality is concerned in the power storage unit. For example, a resistance value of a cell increases due to aged deterioration. Or, ground fault may occur in which a cell short-circuits to a ground potential. Therefore, there has been conventionally proposed an abnormality detection circuit for detecting such an abnormality, and a protection circuit for preventing extension of such an abnormality.

For example, a storage battery ground fault detection circuit disclosed in Japanese Patent Laying-Open No. 7-146321 (PTD 1) is used for an uninterruptable power supply device. This uninterruptable power supply device includes an alternating current power supply, a rectifier, an inverter, and a storage battery. The alternating current power supply is grounded at its one end. The rectifier is connected to the alternating current power supply and converts alternating current power into direct current power. The inverter converts direct current power outputted from the rectifier into alternating current power. The storage battery is connected to a direct current intermediate circuit coupling a direct current side of the rectifier and a direct current side of the inverter. In such an uninterruptable power supply device, an alternating current ground current detection means for detecting an alternating current ground current is provided on an alternating current side of the rectifier.

Japanese Patent Laying-Open No. 2002-159135 (PTD 2) discloses a ground fault protection circuit for an electric double layer capacitor module. The electric double layer capacitor module is constituted of a plurality of cells connected in series. This ground fault protection circuit includes current detection means and a breaker. The current detection means is provided on a ground terminal side of the electric double layer capacitor module. The breaker is provided in series on the ground terminal side of the electric double layer capacitor module and is opened based on a current value detected by the current detection means.

CITATION LIST

Patent Document

PTD 1: Japanese Patent Laying-Open No. 7-146321
PTD 2: Japanese Patent Laying-Open No. 2002-159135

SUMMARY OF INVENTION

Technical Problem

To prepare for the case where an abnormality such as a rise in a resistance of a cell or ground fault occurs, the abnormality detection circuit is required to accurately detect an abnormality of the power storage unit. An object of the present invention is to provide an abnormality detection unit with a simple configuration capable of accurately detecting an abnormality in a power storage unit and a power storage device including the same.

Solution to Problem

According to one aspect of the present invention, an abnormality detection circuit detects an abnormality of a power storage device. The power storage device includes a converter, a power storage unit, and an inverter. The converter converts alternating current power supplied from an alternating current power supply into direct current power and outputs a positive electrical potential and a negative electrical potential having absolute values equal to each other. The power storage unit stores direct current power generated by the converter. The inverter is configured to convert direct current power from the converter and direct current power stored in the power storage unit into alternating current power and supply the same to a load. The power storage unit includes a positive electrode terminal, a negative electrode terminal, and a power storage module. The positive electrode terminal and the negative electrode terminal respectively receive the positive electrical potential and the negative electrical potential from the converter. The power storage module is connected between the positive electrode terminal and the negative electrode terminal. The power storage module has a plurality of cells connected in series between the positive electrode terminal and the negative electrode terminal. The abnormality detection circuit includes a voltage detection circuit and a control circuit. The voltage detection circuit is configured to detect an electrical potential of an intermediate node located at an intermediate position between the positive electrode terminal and the negative electrode terminal on a basis of a ground potential. The intermediate node is a node between two cells located at an intermediate position between the positive electrode terminal and the negative electrode terminal among the plurality of cells. The control circuit is configured to determine an abnormality of the power storage module based on a change in a detection value of the voltage detection circuit from the ground potential.

Preferably, the abnormality of the power storage module is at least one of ground fault and an increase in a resistance value at any cell among the plurality of cells.

Preferably, the control circuit determines that the power storage module is abnormal when the detection value is out of a predetermined reference range defined by an upper limit value higher than the ground potential and a lower limit value lower than the ground potential.

Preferably, when the detection value is higher than the upper limit value, the control circuit specifies the abnormality occurring location at a location between the negative electrode terminal and the intermediate node. When the detection value is lower than the lower limit value, the control circuit specifies the abnormality occurring location at a location between the positive electrode terminal and the intermediate node.

Preferably, the power storage module includes first to n-th (n is a natural number greater than or equal to 3) modules. The voltage detection circuit includes first to n-th voltage detection units provided to correspond respectively to the first to n-th modules. The control circuit calculates a mode of respective first to n-th detection values from the first to n-th voltage detection units and corrects the upper limit value and the lower limit value based on the mode.

Preferably, the power storage module includes first to n-th (n is a natural number greater than or equal to 2) modules. The voltage detection circuit includes first to n-th voltage detection units provided to correspond respectively to the first to n-th modules. The control circuit calculates difference values of the first to n-th detection values from respective first to n-th voltage detection units and determines that an abnormality has occurred in the power storage module when an absolute value of the difference value is higher than a predetermined reference value.

Preferably, the power storage module includes first to n-th (n is a natural number greater than or equal to 3) modules. The voltage detection circuit includes first to n-th voltage detection units provided so as to correspond respectively to the first to n-th modules. The control circuit calculates a mode of respective first to n-th detection values from the first to n-th voltage detection units, calculates first to n-th difference values between the first to n-th detection values and the mode, and determines that an abnormality has occurred in the power storage module when at least one of absolute values of the difference values is higher than a predetermined reference value.

According to yet another aspect of the present invention, the power storage device includes a converter, a power storage unit, an inverter, and the above-described abnormality detection circuit.

Preferably, the power storage device further includes a breaking unit. The breaking unit is provided between a connection point of the converter with the inverter and the power storage unit and is shifted from a conductive state to a non-conductive state in response to a breaking signal. The control circuit outputs the breaking signal to the breaking unit when it determines that an abnormality has occurred in the power storage module.

Preferably, the power storage device further includes a notifying unit configured to notify an abnormality to a user. The control circuit controls the notifying unit so as to notify the abnormality when it determines that the power storage module is abnormal.

Preferably, the power storage unit is either a storage battery or a capacitor.

Advantageous Effects of Invention

According to the present invention, when an abnormality such as a rise in a resistance or ground fault in a cell of a power storage unit, the abnormality in the power storage unit can be detected accurately with a simple configuration.

BRIEF DESCRIPTION OF DRAWINGS

FIG. 2 is a circuit block diagram schematically representing a configuration of the power storage unit shown in FIG. 1.

FIG. 3 is a diagram for illustrating an occurrence of an abnormality in the power storage unit shown in FIG. 1.

DESCRIPTION OF EMBODIMENTS

Figure 1:
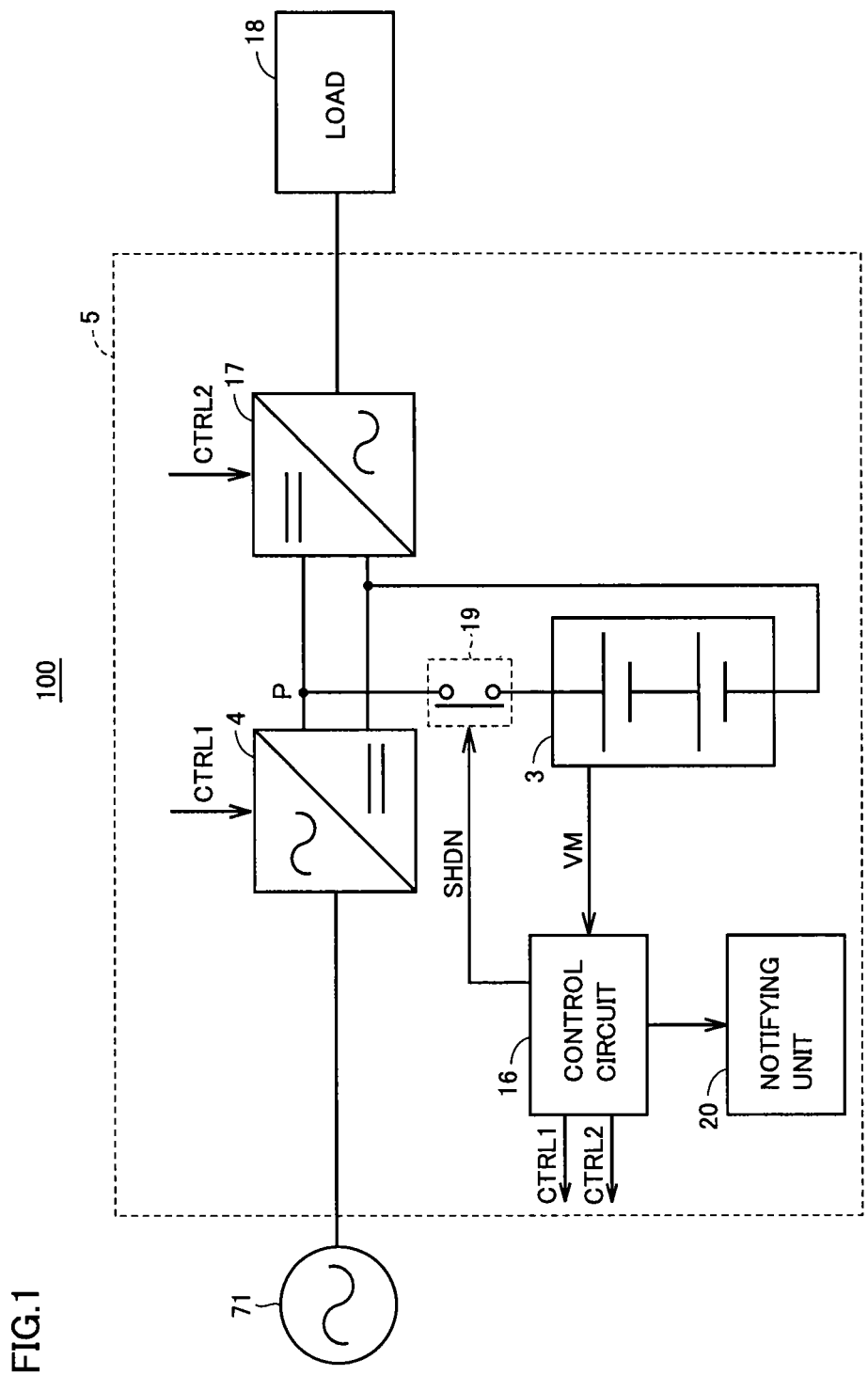
FIG. 1 is a circuit block diagram schematically representing a configuration of a power storage system including an abnormality detection circuit according to a first embodiment of the present invention.

Hereinafter, embodiments of the present invention will be described in detail with reference to the drawings. It should be noted that the same or corresponding parts in the drawings have the same reference numerals allotted, and description thereof will not be repeated.

First Embodiment

FIG. 1 is a circuit block diagram schematically representing a configuration of a power storage system including an abnormality detection circuit according to a first embodiment of the present invention. Referring to FIG. 1, power storage system 100 includes an alternating current power supply 71 and an uninterruptable power supply device (power storage device) 5. Uninterruptable power supply device 5 is, for example, an uninterruptable power supply device of a normal inverter feed system. Uninterruptable power supply device 5 includes a converter 4, a power storage unit 3, an inverter 17, a control circuit 16, a switch 19, and a notifying unit 20.

An alternating current power supply 71 supplies alternating current power, and is, for example, a three-phase alternating current power supply. Alternating current power supply 71 may be a single-phase alternating current power supply. Uninterruptable power supply device 5 receives alternating current power from alternating current power supply 71 and supplies the alternating current power to a load 18.

Control circuit 16 controls entire uninterruptable power supply device 5. Control circuit 16 is, for example, a microcomputer. Converter 4 converts alternating current power from alternating current power supply 71 into direct current power based on a control signal CTRL1 from control circuit 16. Converter 4 generates a positive voltage and a negative voltage having absolute values equal to each other, and supplies the positive voltage and the negative voltage to inverter 17 and power storage unit 3. Power storage unit 3 stores the direct current power generated by converter 4. Power storage unit 3 is a storage battery such as, for example, a lithium-ion battery, a nickel hydride battery, or a lead storage battery. Inverter 17 converts the direct current power from converter 4 or power storage unit 3 into alternating current power based on a control signal CTRL2 from control circuit 16, and supplies the alternating current power to load 18.

Load 18 is not particularly limited as long as it is electrical equipment consuming alternating current power.

A switch 19 is electrically connected between a connection point P of converter 4 with inverter 17 and power storage unit 3. It should be noted that switch 19 is one example of the "breaking unit" according to the present invention. The "breaking unit" according to the present invention may be all necessary to disconnect power storage unit 3 from connection point P in response to a breaking signal SHDN. The "breaking unit" according to the present invention may be achieved by, for example, a contactor or a breaker. Alternatively, it may be achieved by a power device such as an IGBT (Insulated Gate Bipolar Transistor) or a thyristor.

Control circuit 16 monitors a state of power storage unit 3, and outputs breaking signal SHDN when it detects a failure or an abnormality of power storage unit 3. Switch 19 is shifted from a conductive state to a non-conductive state in response to breaking signal SHDN from control circuit 16.

Notifying unit 20 notifies an abnormality of power storage unit 3 to a user or a manager of power storage system 100 based on a control by control circuit 16. Methods for notifying an abnormality may include illuminating an abnormality notifying light (not shown), outputting a state contact point, generating an alarming sound, or displaying a message on a display screen (not shown) of control circuit 16.

FIG. 2 is a circuit block diagram schematically representing a configuration of power storage unit 3 shown in FIG. 1. Referring to FIG. 2, power storage unit 3 includes a positive electrode terminal T1, a negative electrode terminal T2, and a power storage module 2. Moreover, uninterruptable power supply device 5 includes an abnormality detection circuit 200. Abnormality detection circuit 200 includes a voltage detection circuit 8 and control circuit 16. It should be noted that, although inverter 17 and switch 19 (refer to FIG. 1) are also connected to power storage unit 3, only converter 4 is shown in FIG. 2 for clarification of description.

Power storage module 2 is connected between positive electrode terminal T1 and negative electrode terminal T2. Power storage module 2 has 2 m (m is a natural number) cells 1. A charging and discharging voltage of power storage module 2 is dependent on the number of cells 1. As one example, when each cell 1 has a rated voltage of 2.4V, and the number of cells 1 is 200, the rated voltage of power storage module 2 is about 480V. In this case, an electrical potential V2 of positive electrode terminal T1 is about 240V, and an electrical potential V2 of negative electrode terminal T2 is about −240V.

Voltage detection circuit 8 includes a voltage measuring instrument 81 and a grounding resistance 82. One end of grounding resistance 82 is electrically connected to an intermediate node Nm, and the other end thereof is electrically connected to a ground potential GND. Intermediate node Nm is a node between two cells located at an intermediate position between positive electrode terminal T1 and negative electrode terminal T2. In the present embodiment, intermediate node Nm is a node between an m-th cell and an (m+1)-th cell from positive electrode terminal T1.

Voltage measuring instrument 81 is connected to both ends of grounding resistance 82 and detects an electrical potential of intermediate node Nm on a basis of ground potential GND. Hereinafter, the electrical potential of intermediate node Nm on a basis of ground potential GND is also referred to as an intermediate ground potential VM. Moreover, unless particularly described, the "electrical potential" means the electrical potential on the basis of ground potential GND. Voltage detection circuit 8 outputs a value of intermediate ground potential VM detected by voltage measuring instrument 81 to control circuit 16. Voltage detection circuit 8 and control circuit 16 may be provided at the same substrate. Alternatively, voltage detection circuit 8 and control circuit 16 may be provided at different circuit boards. In this case, an insulated transformer or an isolation amplifier may be used for voltage measuring instrument 81.

Various abnormalities may occur in power storage unit 3. FIG. 3 is a diagram for illustrating occurrence of an abnormality in power storage unit 3 shown in FIG. 1. Referring to FIG. 3, a case will be described where an abnormality has occurred at a k-th (k is a natural number less than or equal to m) cell 1k from positive electrode terminal T1, in other words, cell 1k located on a side of positive electrode terminal T1 from intermediate node Nm.

The abnormality of cell 1k includes a rise in a resistance, an open circuit failure, or ground fault at cell 1k. The rise in the resistance of cell 1 indicates a state where an internal resistance value of cell 1 becomes abnormally greater. Repeated charging and discharging of cell 1 deteriorates cell 1. Therefore, the internal resistance value of cell 1 becomes greater. The open circuit failure of cell 1 is a failure in which cell 1 becomes an open state due to a progress of the rise in the resistance or lowering in capacity of cell 1, or a failure in which cell 1 becomes an opened state due to disconnection or contact failure. The ground fault of cell 1 is a failure in which cell 1 is short-circuited to ground potential GND. The ground fault of cell 1k is caused by an electrolytic solution in cell 1k leaking out due to, for example, a safety valve operation or case breakage of cell 1k.

Figure 4:
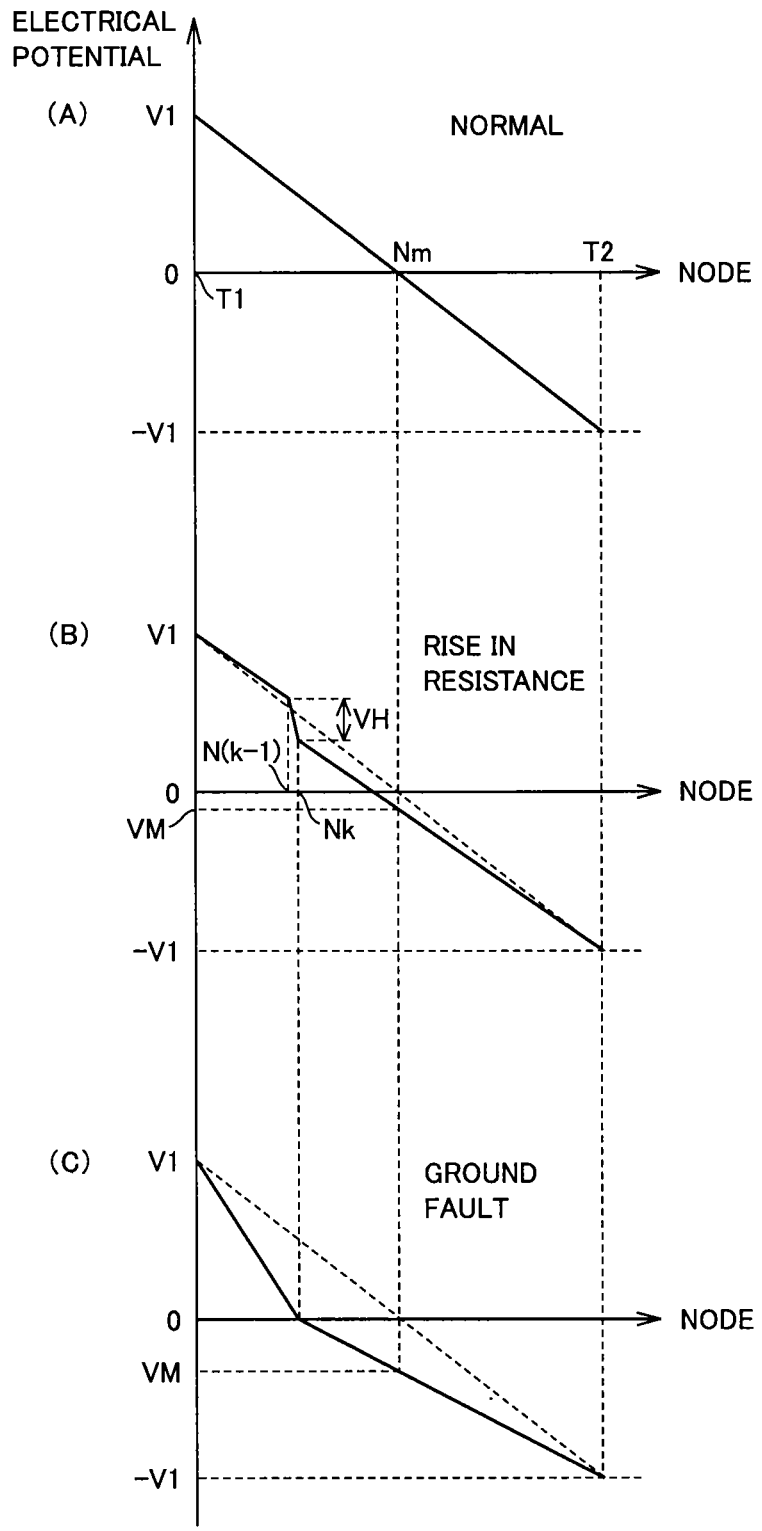
FIG. 4 is a diagram for illustrating a change in an electrical potential of a node between each cell in the power storage module shown in FIG. 3.

FIG. 4 is a diagram for illustrating a change in an electrical potential of a node between each cell in power storage module 2 shown in FIG. 3. Referring to FIG. 4, the horizontal axis denotes an order of a node located between positive electrode terminal T1 and negative electrode terminal T2. The vertical axis denotes an electrical potential on the basis of ground potential GND of each node. FIG. 4(A) shows an electrical potential of each node in the case where all of cells 1 are normal. FIG. 4(B) shows an electrical potential of each node in the case where the rise in the resistance has occurred in cell 1. FIG. 4(C) shows an electrical potential of each node in the case where the ground fault has occurred in cell 1.

Firstly, the case will be described where all of cells 1 are normal. Referring to FIG. 4(A), the number (m) of cells 1 connected between positive electrode terminal T1 and intermediate node Nm and the number (m) of cells 1 connected between negative electrode terminal T2 and intermediate node Nm are equal. A voltage drop at each cell is equal. Therefore, a sum of a voltage drop at cells 1 connected between positive electrode terminal T1 and intermediate node Nm and a sum of a voltage drop at cells 1 connected between negative electrode terminal T2 and intermediate node Nm are equal. Electrical potential V1 of positive electrode terminal T1 and electrical potential V2 of negative electrode terminal T2 have inversed polarities and equal absolute values (V2=−V1) by a control of converter 4. Thus, intermediate ground potential VM is equal to ground potential GND (0V).

Next, the case where the rise in the resistance has occurred at cell 1k will be described. Referring to FIG. 4(B), node N(k−1) and node Nk are nodes at both ends of cell 1k.

A resistance value of normal cell 1 is, for example, about 2 mΩ. On the other hand, a resistance value of cell 1k at which the rise in the resistance has occurred increases to, for example, about 100 mΩ. Equal current flows through all of the cells. Therefore, a voltage VH at cell 1k becomes higher than a voltage at each normal cell 1. All of the voltage at each normal cell 1 is equal. Node Nk is located on a side of positive electrode terminal T1 from intermediate node Nm. Thus, a sum of a voltage at cells connected between positive electrode terminal T1 and intermediate node Nm is higher than a sum of a voltage at cells connected between negative electrode terminal T2 and intermediate node Nm. Even in the case where the rise in the resistance has occurred at cell 1k, electrical potential V1 of positive electrode terminal T1 and electrical potential V2 of negative electrode terminal T2 do not change from the case where all of cells 1 are normal, by a control of converter 4. Therefore, intermediate ground potential VM becomes negative.

As described above, by detecting the change in intermediate ground potential VM, the rise in the resistance of cell 1k can be detected. Moreover, by detecting that intermediate ground potential VM is changed in the negative direction, the presence of the cell with a raised resistance between positive electrode terminal T1 and intermediate node Nm can be detected. In other words, an abnormality of a cell on a side of positive electrode terminal T1 from the intermediate node Nm can be detected.

Next, the case where the ground fault has occurred at cell 1k will be described. Referring to FIG. 4(C), the electrical potential of cell 1k becomes equal to ground potential GND by the ground fault. Therefore, an electrical potential difference (V1) between positive electrode terminal T1 and node Nk is equally divided at cells 1 connected between positive electrode terminal T1 and node N(k−1). Moreover, electrical potential difference (V1) between node Nk and negative electrode terminal T2 is equally divided at cells 1 connected between node Nk and negative electrode terminal T2. Intermediate node Nm is located on a side of negative electrode terminal T2 from node Nk. Thus, intermediate ground potential VM becomes negative. As described above, by detecting the change in intermediate ground potential VM, the ground fault of cell 1k can be detected. Moreover, by detecting that intermediate ground potential VM changes in the negative direction, the presence of the ground fault occurring location between positive electrode terminal T1 and intermediate node Nm can be detected. In other words, also in the case where the abnormality of the cell on a side of positive electrode terminal T1 from intermediate node Nm is the ground fault, the abnormality of the cell can be detected.

Ideally, when intermediate ground potential VM has changed from 0V, control circuit 16 can determine that an abnormality has occurred in power storage module 2. However, in reality, due to a variation in resistance values between 2 m cells 1, a value of intermediate ground potential VM may be different from 0V even when all of cells are normal. Thus, at control circuit 16, an upper limit value Vup and a lower limit value Vlo are defined as a reference range of intermediate ground potential VM. Upper limit value Vup is higher than ground potential GND, and lower limit value Vlo is lower than ground potential GND. When intermediate ground potential VM is within the reference range, control circuit 16 determines power storage module 2 as being normal. On the other hand, when intermediate ground potential VM is out of the reference range (when intermediate ground potential VM is lower than lower limit value Vlo or higher than upper limit value Vup), control circuit 16 determines that an abnormality has occurred in power storage module 2.

Figure 5:
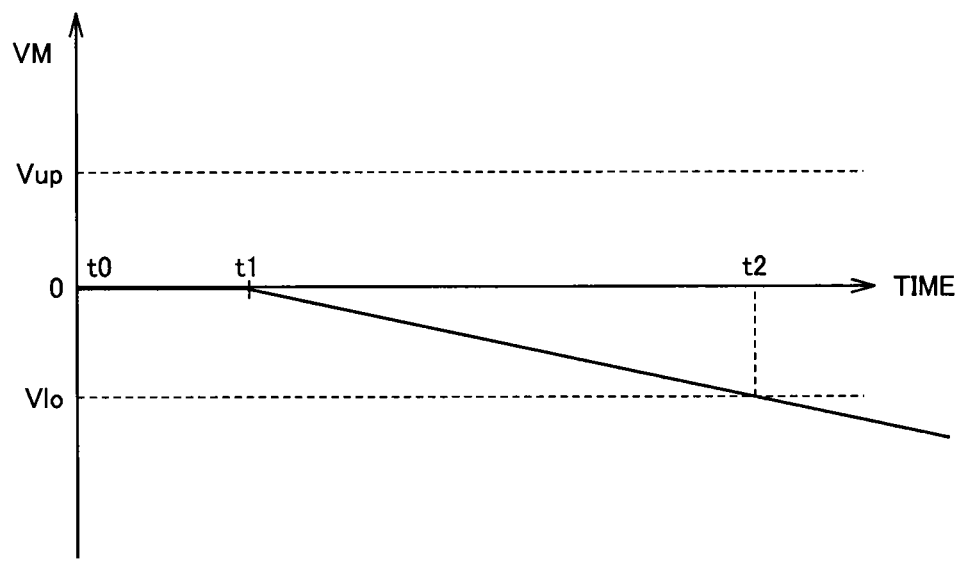
FIG. 5 is a diagram for illustrating a change in a detection value at a power storage module when a rise in a resistance occurs in a cell in the power storage unit shown in FIG. 3.

FIG. 5 is a diagram for illustrating a change in intermediate ground potential VM in power storage module 2 when the rise in the resistance has occurred at cell 1k in power storage unit 3 shown in FIG. 3. Referring to FIG. 5, the horizontal axis denotes a time axis. The vertical axis represents intermediate ground potential VM. For example, the time of starting use of uninterruptable power supply device 5 is time t0.

During the period from time t0 to time t1, intermediate ground potential VM is substantially equal to ground potential GND. However, due to the rise in the resistance at cell 1k, intermediate ground potential VM is changed in the negative direction after time t1. At time t2, intermediate ground potential VM becomes lower than lower limit value Vlo. Accordingly, control circuit 16 determines that an abnormality has occurred at any of the cells between positive electrode terminal T1 and intermediate node Nm.

It should be noted that, when an open circuit failure has occurred at cell 1k, the resistance value at cell 1k is very large, and is ideally infinite. Therefore, since charging and discharging currents do not flow to power storage module 2 to which cell 1k is connected, intermediate ground potential VM at power storage module 2 becomes indefinite. Accordingly, control circuit 16 determines that an abnormality has occurred at a cell included in power storage module 2.

Figure 6:
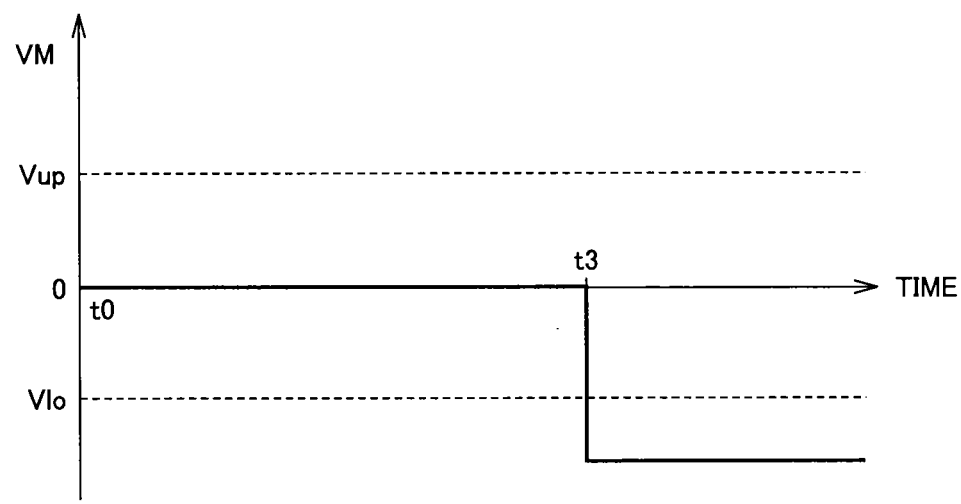
FIG. 6 is a diagram for illustrating a change in a detection value at a power storage module when ground fault occurs in the power storage unit shown in FIG. 3.

FIG. 6 is a diagram for illustrating a change in intermediate ground potential VM in power storage module 2 when ground fault has occurred at cell 1k in power storage unit 3 shown in FIG. 3. Referring to FIG. 6, FIG. 6 is compared with FIG. 5. At time t3, the ground fault occurs at cell 1k. As described above, intermediate ground potential VM is changed in the negative direction and becomes lower than lower limit value Vlo. Accordingly, control circuit 16 determines that an abnormality has occurred at any of the cells connected between positive electrode terminal T1 and intermediate node Nm.

In the description above, the case was described where an abnormality has occurred at cell 1k connected between positive electrode terminal T1 and intermediate node Nm. When an abnormality has occurred at a cell connected between negative electrode terminal T2 and intermediate node Nm, a direction of a change in intermediate ground potential VM is inversed. In other words, when the rise in the resistance or ground fault has occurred at the cell, intermediate ground potential VM is changed from 0V in the positive direction. Even though the directions in the change are different, the changes in intermediate ground potential VM in these cases are the same as the change in intermediate ground potential VM in FIGS. 3 to 6. Therefore, detailed description will not be repeated.

Figure 7:
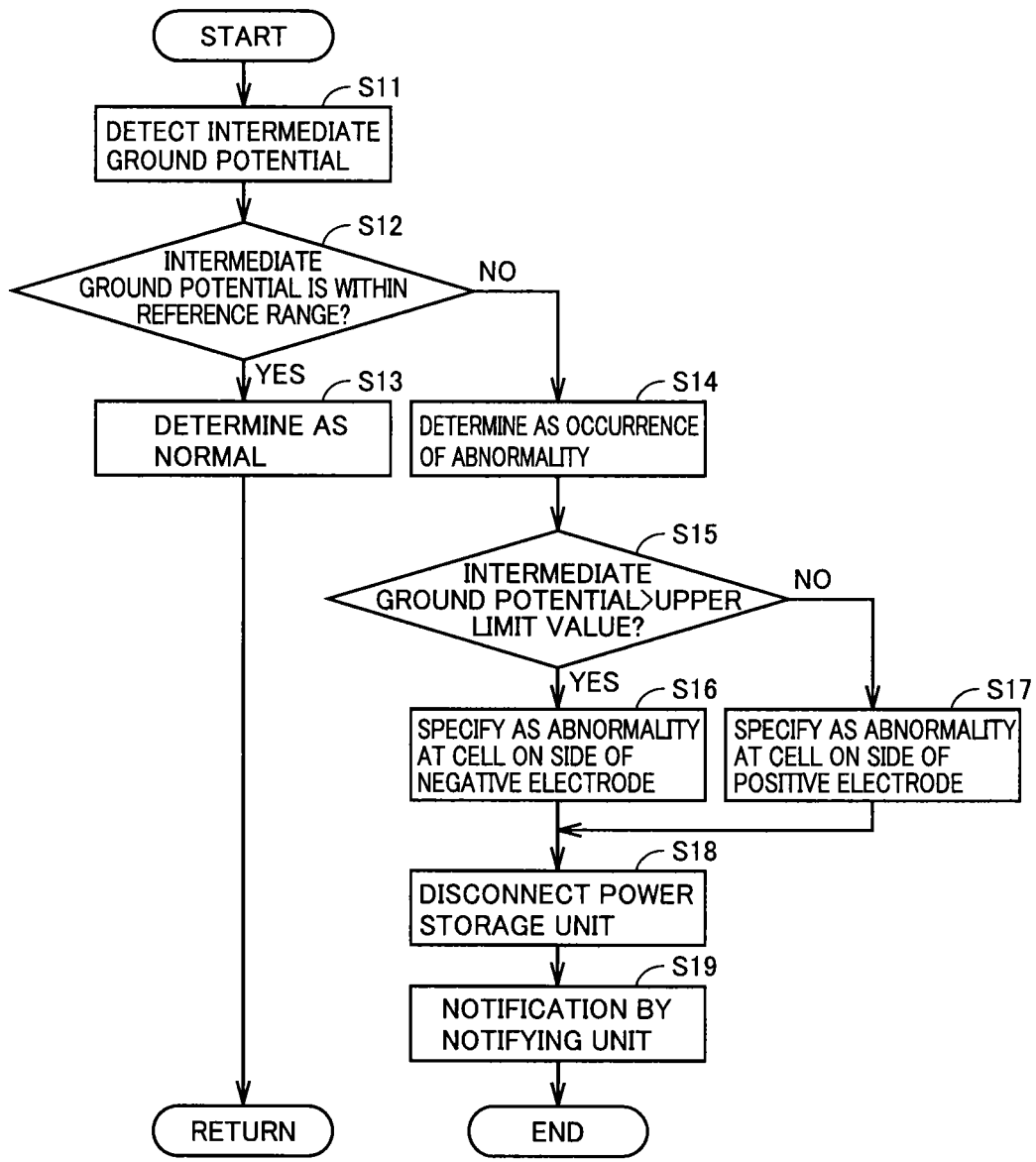
FIG. 7 is a flowchart for illustrating a control by the control unit shown in FIG. 3.

FIG. 7 is a flowchart for illustrating a control by control circuit 16 shown in FIG. 1. Referring to FIG. 7, a processing is started, for example, when operation of power storage system 100 is started.

In Step S11, voltage detection circuit 8 detects intermediate ground potential VM and outputs the detected value to control circuit 16. In Step S12, control circuit 16 determines whether or not intermediate ground potential VM is within the reference range. When intermediate ground potential VM is within the reference range (YES in Step S12), the processing proceeds to Step S13. When intermediate ground potential VM is out of the reference range (NO in Step S12), the processing proceeds to Step S14.

In Step S13, control circuit 16 determines that power storage module 2 is normal. After that, a series of processing is repeated.

On the other hand, in Step S14, control circuit 16 determines that an abnormality has occurred in power storage module 2. In Step S15, when intermediate ground potential VM is higher than upper limit value Vup (YES in Step S15), the processing proceeds to Step S16. When intermediate ground potential VM is lower than lower limit value Vlo (NO in Step S15), the processing proceeds to Step S17.

In Step S16, control circuit 16 specifies that an abnormality occurring location in power storage module 2 is any of the cells connected between negative electrode terminal T2 and intermediate node Nm. In Step S17, control circuit 16 specifies that an abnormality occurring location in power storage module 2 is any of the cells connected between positive electrode terminal T1 and intermediate node Nm. As described above, by detecting the direction of the change in intermediate ground potential VM, it can be determined if an abnormality occurring location in power storage module 2 is on a side of positive electrode terminal T1 or on a side of negative electrode terminal T2 from intermediate node Nm.

After termination of the processing of Step S16 or Step S17, control circuit 16 outputs a breaking signal SHDN to switch 19 in Step S18. In response to breaking signal SHDN, switch 19 is shifted from the conductive state to the non-conductive state. Accordingly, power storage unit 3 is disconnected from converter 4 and inverter 17. Thus, continuous charging and discharging of power storage unit 3 having an abnormality can be prevented. Therefore, extension of an abnormality in power storage unit 3 can be prevented.

Further, in Step S19, control circuit 16 controls notifying unit 20 so as to notify that an abnormality has occurred in power storage module 2. Control circuit 16 controls notifying unit 20 to notify a result of specifying an abnormality in Steps S16 and S17. After termination of the processing in Step S19, the series of processing is completed.

It should be noted that the order of the processing of Step S18 may be replaced with the processing of Steps S15 to S17. In this case, switch 19 is shifted from the conductive state to the non-conductive state (the processing of Step S18) immediately after the detection of an abnormality in power storage module 2 (the processing of Step S14). Thus, extension of the abnormality in power storage unit 3 can be prevented more promptly.

Next, the reason why an abnormality in power storage unit 3 can be detected accurately by the present embodiment will be described. One node is present between two adjacent cells 1. Thus, (2 m−1) nodes are present at 2 m cells 1.

Figure 8:
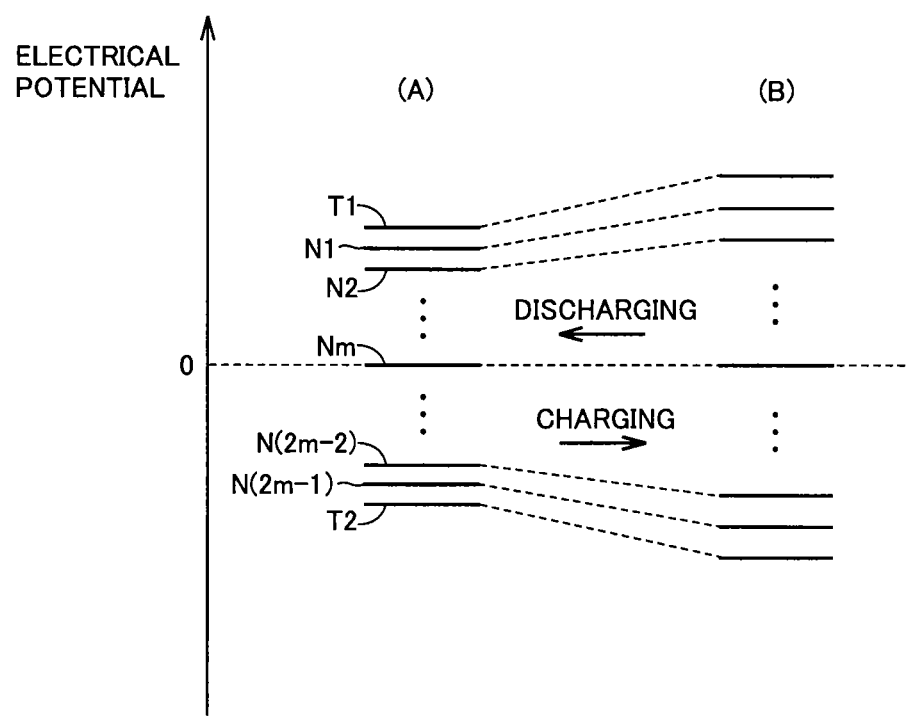
FIG. 8 is a diagram representing a change in an electrical potential of each node on the basis of a ground potential due to charging and discharging of the power storage unit shown in FIG. 3.

FIG. 8 represents a change in an electrical potential at each node on the basis of ground potential GND by charging and discharging of power storage unit 3 shown in FIG. 3. Referring to FIG. 8, FIG. 8(A) shows an electrical potential of each node on the basis of ground potential GND after termination of discharging. FIG. 8(B) represents an electrical potential of each node on the basis of ground potential GND in a fully-charged state. A node between a first cell and a second cell from positive electrode terminal T1 is represented as a node N1. This similarly applies to nodes N2, N(2 m−2), and N(2 m−1).

During charging and discharging in the normal state of power storage unit 3, an electrical potential of each node on the basis of ground potential GND is shifted between the states shown in FIGS. 8(A) and 8(B). Referring to FIG. 8(B), when power storage unit 3 is normal, each cell 1 is equally charged. Moreover, the number of nodes included between positive electrode terminal T1 and intermediate node Nm and the number of nodes included between negative electrode terminal T2 and intermediate node Nm are equal. Further, during charging or in a fully charged state of power storage unit 3, electrical potentials of positive electrode terminal T1 and negative electrode terminal T2 on the basis of ground potential GND have inversed polarities and equal absolute values by a control of converter 4. Thus, an electrical potential of intermediate node Nm on the basis of ground potential GND (intermediate ground potential VM) during charging or in the fully charged state becomes substantially 0V.

On the other hand, referring to FIG. 8(A), during discharging from power storage unit 3, a voltage between positive electrode terminal T1 and negative electrode terminal T2 is gradually reduced at a rate in accordance with a value of current discharged from power storage unit 3. When power storage unit 3 is normal, it is equally discharged from each cell 1. Therefore, also during discharging and after termination of discharging, electrical potentials of positive electrode terminal T1 and negative electrode terminal T2 on the basis of ground potential GND have inversed polarities and equal absolute values. Thus, the electrical potential of intermediate node Nm on the basis of ground potential GND is substantially 0V.

When a voltage change in power storage unit 3 is simply detected at the time of occurrence of an abnormality, an electrical potential of any node among the above-described (2 m−1) nodes may be monitored. For example, a change in an electrical potential of node N1 can be monitored. However, the electrical potential of node N1 is greatly changed in accordance with charging and discharging of power storage unit 3. According to the present embodiment, voltage detection circuit 8 is connected to intermediate node Nm. In the normal state of power storage unit 3, the electrical potential of intermediate node Nm has the smallest electrical potential difference with respect to ground potential GND, and is substantially 0V. Further, also when power storage unit 3 is charged and discharged, the electrical potential of intermediate node Nm is maintained at 0V. However, the electrical potential of intermediate node Nm is changed from 0V in the positive or negative direction when an abnormality occurs in power storage unit 3. Thus, according to the present embodiment, an abnormality in power storage unit 3 can be detected accurately.

It should be noted that the case was described where the number of cells 1 is 2 m (even number). However, the present invention can be applied even when the number of cells 1 is an odd number. When the number of cells 1 is (2 m+1), voltage detection circuit 8 is connected to any of intermediate node Nm connecting an m-th cell and an (m+1)-th cell from positive electrode terminal T1 and intermediate node N(m+1) connecting an (m+1)-th cell an (m+2)-th cell from positive electrode terminal T1. In this case, as compared to the case where the number of cells 1 is an even number, intermediate ground potential VM changes by a voltage of one cell 1 in the positive or negative direction on the basis of ground potential GND. When upper limit value Vup and lower limit value Vlo of the reference range are set in accordance with this change, an odd number of cells 1 can be handled in the same manner as the case of an even number.

Modified Example

Figure 9:
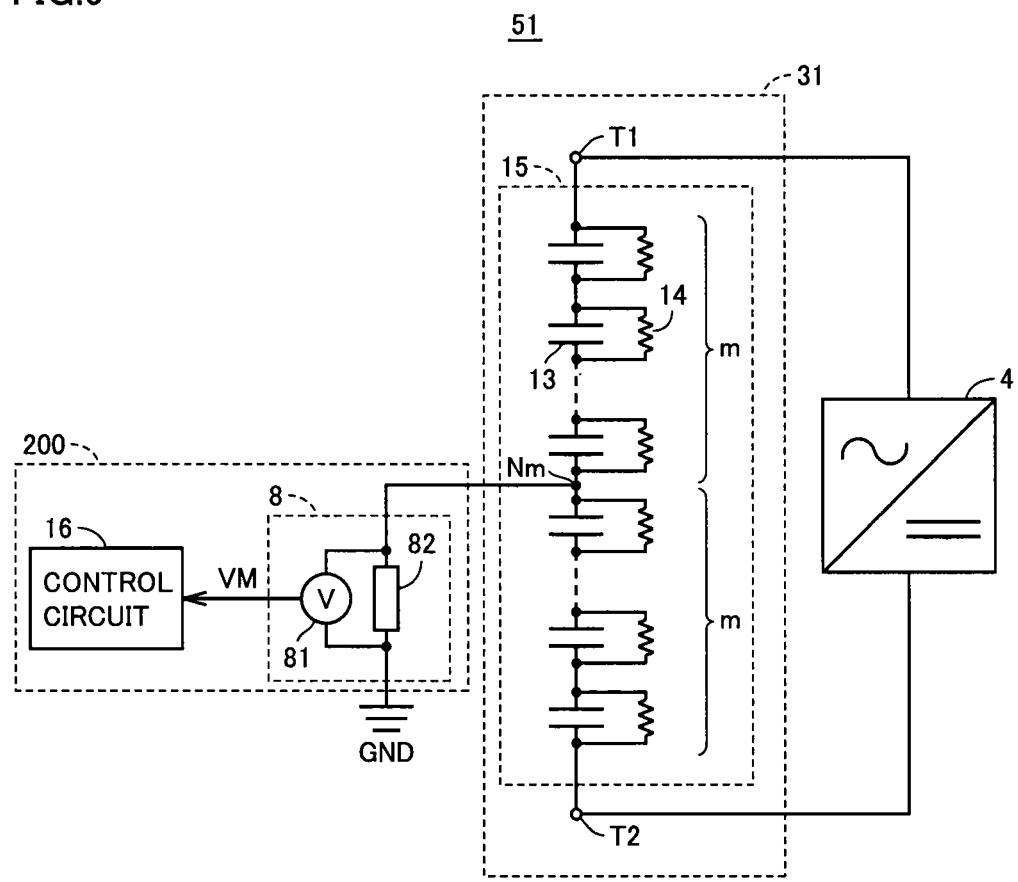
FIG. 9 is a circuit block diagram schematically representing a power storage device according to a modified example of the first embodiment of the present invention.

FIG. 9 is a circuit block diagram schematically representing a configuration of an uninterruptable power supply device in accordance with a modified example of the first embodiment of the present invention. Referring to FIG. 9, an uninterruptable power supply device 51 according to the modified example of the first embodiment of the present invention is different from uninterruptable power supply device 5 shown in FIG. 2 in that it includes a power storage unit 31 in place of power storage unit 3. Power storage unit 31 is a capacitor, and it is for example an electric double layer capacitor or a lithium ion capacitor.

Power storage unit 31 includes power storage module 15. Power storage module 15 has 2 m cells 13 and 2 m balance resistors 14. Due to factors such as production variation and the like, electrostatic capacities of cells 13 can be non-uniform. When a charging current I flows to an ideal cell for time t, a charging voltage V of a cell having an electrostatic capacity C is expressed by $I \times t = C \times V$. When charging current I flows through 2 m cells 1, a cell having a small electrostatic capacity have a higher voltage than a cell having a large electrostatic capacity.

Therefore, balance resistors 14 connected in parallel with respective cells 13 so as to equally charge the plurality of cells 13 cause the voltage applied to power storage module 15 to be substantially equally divided between cells 13. As one example, when a rated voltage of each cell 13 is 2.35V, and the number of cells 13 is 300, the rated voltage of power storage module 2 is about 700V. Since other configuration of power storage unit 31 is equivalent to the configuration of power storage unit 3 (refer to FIG. 2), detailed description thereof will not be repeated.

Figure 10:
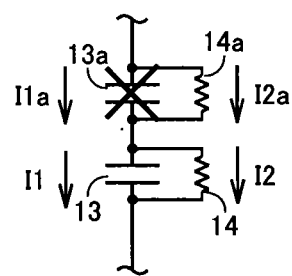
FIG. 10 is a diagram for illustrating an occurrence of an abnormality in the power storage unit shown in FIG. 9.

FIG. 10 is a diagram for illustrating occurrence of an abnormality in power storage module 15 shown in FIG. 9. Referring to FIG. 10, balance resistor 14a is connected in parallel with cell 13a. Cell 13 is normal. Balance resistor 14 is connected in parallel with cell 13. Charging and discharging currents flowing through cells 13a, 13 are respectively referred to as currents Ia, I1. Charging and discharging currents flowing through balance resistors 14a, 14 are respectively referred to as currents I2a, I2. Before an abnormality occurs in power storage module 15, current I1a and current I1 are equal. Current I2a and current I2 are equal. Moreover, a sum of current at cell 13a and balance resistor 14a (I1a+I2a) and a sum of current at cell 13 and balance resistor 14 (I1+I2) are equal (I1a+I2a=I1+I2).

When a rise in a resistance occurs at cell 13a, an internal resistance of cell 13a increases significantly. Accordingly, a combined resistance value of cells 13, 13a and balance resistors 14, 14a also increases. Thus, each of a sum of current (I1a+I2a) and a sum of current (I1+I2) is reduced as compared to the time before the rise in the resistance occurs at cell 1k.

Current I1a is reduced at cell 13a, where the rise in the resistance has occurred, and balance resistor 14a. Current I2a is increased by that reduced amount. On the other hand, at normal cell 13 and balance resistor 14, a ratio of current I1 and current I2 does not change from the time when the rise in the resistance occurs at cell 13a. The resistance value of balance resistor 14a is equal to the resistance value of balance resistor 14. Therefore, the voltage at balance resistor 14a becomes higher than the voltage at balance resistor 14. Accordingly, the voltage becomes higher at the cell where the rise in the resistance has occurred.

In this case, the distribution of voltage between cells becomes the same as the distribution shown in FIG. 4(B). Thus, similarly to the description of the rise in the resistance at a cell in the case where power storage unit 3 is a storage battery, intermediate ground potential VM is changed in the negative direction when the rise in the resistance occurs at the cells connected between positive electrode terminal T1 and intermediate node Nm. On the other hand, when the rise in the resistance occurs at the cells connected between negative electrode terminal T2 and intermediate node Nm, intermediate ground potential VM is changed in the positive direction. Accordingly, control circuit 16 can detect an abnormality at power storage unit 3. Further, control circuit 16 can specify an abnormality occurring location.

It should be noted that, when an open circuit failure occurs at cell 13a, all of currents flow to balance resistor 14a connected in parallel with cell 13a, and it is common with the rise in the resistance at cell 13a. Thus, since the method for determining an open circuit failure at cell 13a is similar to the method for determining the rise in the resistance at cell 13a, detailed description will not be repeated.

It should be noted that, since the change in the charging and discharging voltage in the case where the ground fault occurs at cell 13a is equivalent to the change in the case where cell 13a is a storage battery (refer to FIGS. 4(C) and 6), detailed description will not be repeated. Also in the case where the power storage unit is a capacitor as described above, an abnormality such as the rise in the resistance, the open circuit failure, or the ground fault can be detected as with the case of the storage battery.

Second Embodiment

As described above, generally in a power storage unit, a plurality of power storage modules are connected in parallel to secure a required capacity. In the second embodiment, a voltage detection unit is provided at each of a plurality of power storage modules. With use of an intermediate ground potential at each power storage module, a reference range of the intermediate ground potential can be corrected.

Figure 11:
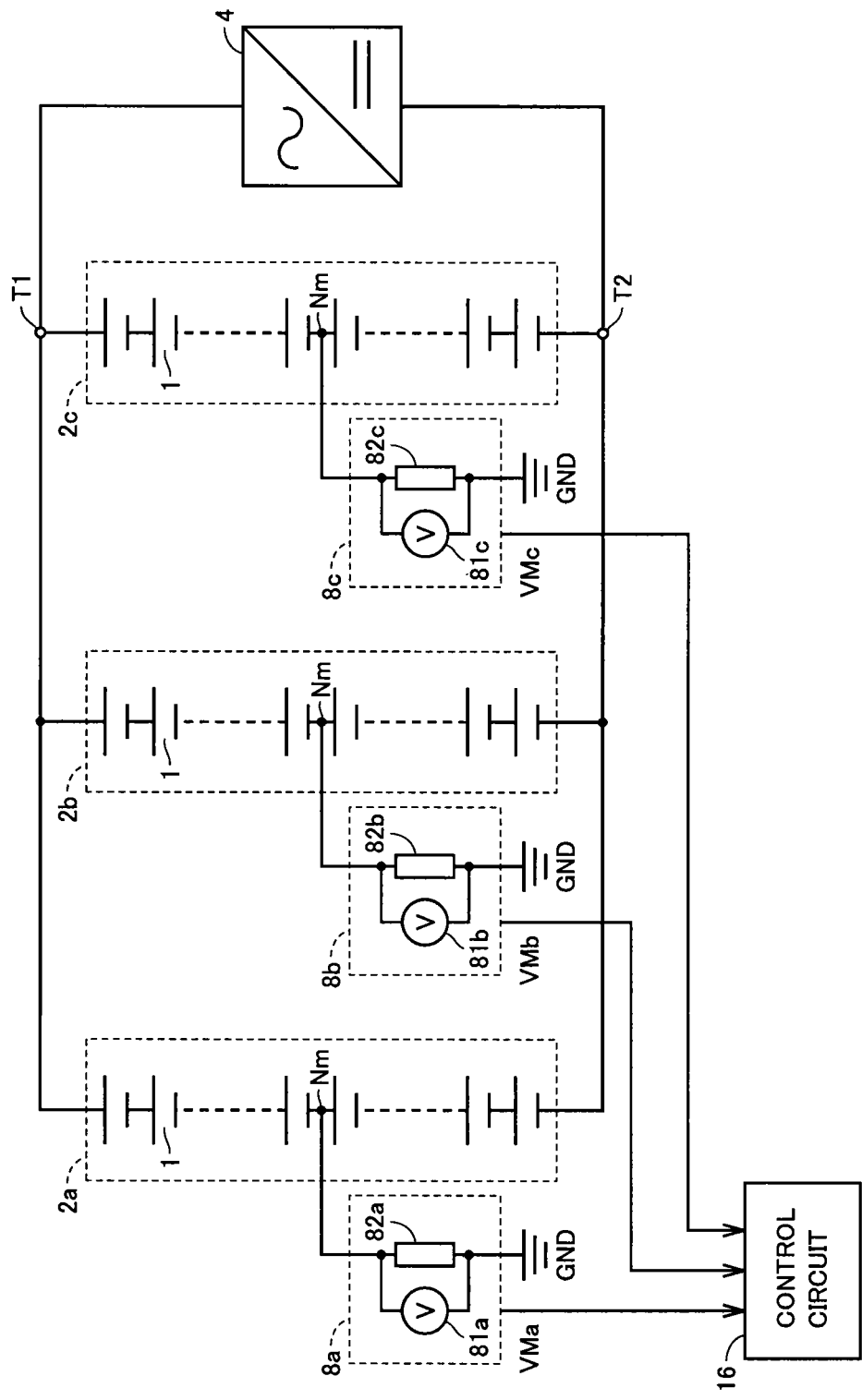
FIG. 11 is a circuit block diagram schematically representing a configuration of a power storage unit including an abnormality detection unit according to a second embodiment of the present invention.

FIG. 11 is a circuit block diagram schematically representing a configuration of an uninterruptable power supply device including an abnormality detection circuit according to the second embodiment of the present invention. Referring to FIG. 11, an uninterruptable power supply device 52 is different from uninterruptable power supply device 5 shown in FIG. 2 in that it includes three power storage modules 2a to 2c connected in parallel in place of power storage module 2. It should be noted that the number of power storage modules may be three or greater, and is not limited to three. Moreover, in FIG. 11, for clarification of the description, only a part of uninterruptable power supply device 52 related to an abnormality detection of a power storage unit is shown. Since other configuration of uninterruptable power supply device 52 is the same as the configuration of uninterruptable power supply device 5 shown in FIG. 1, detailed description will not be repeated.

Power storage modules 2a to 2c are provided with voltage detection units 8a to 8c, respectively. Voltage detection unit 8a includes a voltage measuring instrument 81a and a grounding resistance 82a. Voltage detection unit 8b includes a voltage measuring instrument 81b and a grounding resistance 82b. Voltage detection unit 8c includes a voltage measuring instrument 81c and a grounding resistance 82c. Intermediate ground potentials VMa to VMc are intermediate ground potentials of power storage modules 2a to 2c, respectively. Voltage measuring instruments 81a to 81c respectively detect intermediate ground potentials VMa to VMc. Voltage detection units 8a to 8c respectively output detection values of intermediate ground potentials VMa to VMc to control circuit 16. Since other configuration of power storage unit 31 is the same as the configuration of power storage unit 3 shown in FIG. 2, detailed description will not be repeated.

It should be noted that, although it is not illustrated to avoid complexity, power storage modules 2a to 2c in the present embodiment correspond to the "power storage module" according to the present invention. Voltage detection units 8a to 8c correspond to the "voltage detection circuit" according to the present invention. Moreover, control circuit 16 and voltage detection units 8a to 8c correspond to "abnormality detection circuit" according to the present invention.

Figure 12:
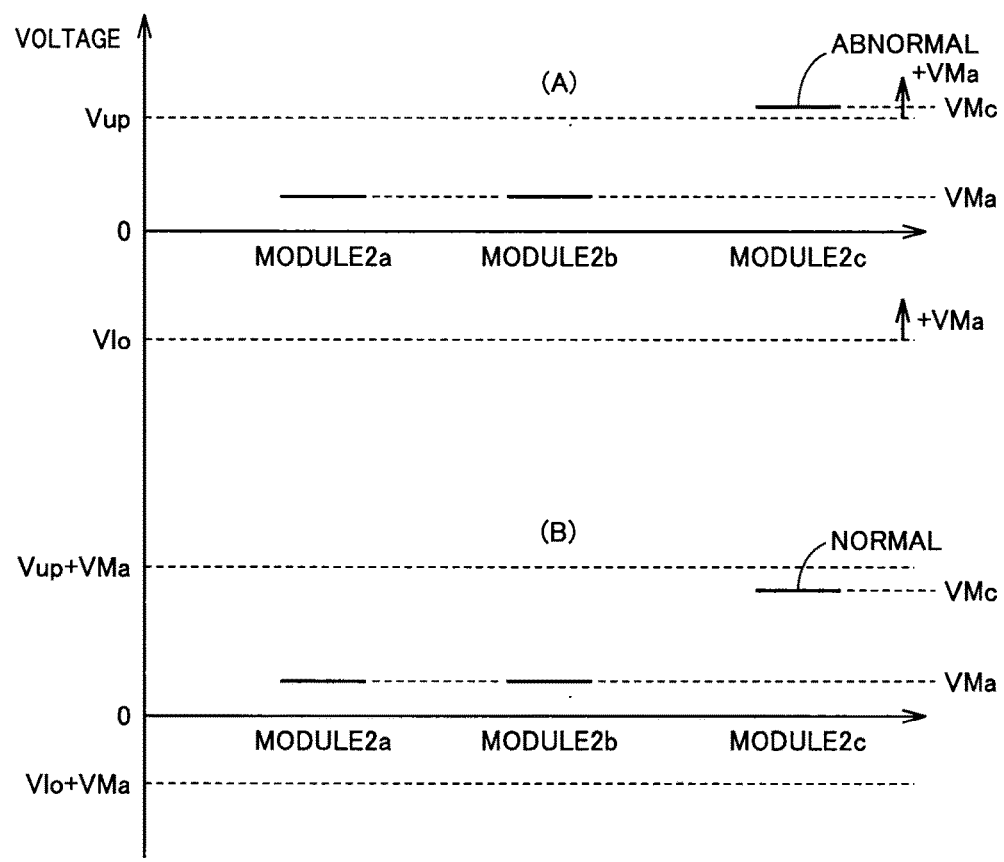
FIG. 12 is a diagram for illustrating detection values at each power storage module before and after correcting a reference range in the power storage device shown in FIG. 11.

FIG. 12 is a diagram for illustrating intermediate ground potentials VMa to VMc at power storage modules 2a to 2c before and after correction of the reference range in uninterruptable power supply device 52 shown in FIG. 11. FIG. 12(A) represents the reference range of intermediate ground potentials VMa to VMc before correction. FIG. 12(B) represents the reference range of intermediate ground potentials VMa to VMc after correction.

Referring to FIG. 12(A), intermediate ground potential VMa of power storage module 2a and intermediate ground potential VMb of power storage module 2b are equal. On the other hand, intermediate ground potential VMc of power storage module 2c is different from intermediate ground potential VMa of power storage modules 2a, 2b. Thus, a mode Vmode of intermediate ground potentials VMa to VMc is VMa.

Referring to FIG. 12(B), control circuit 16 determines that the amount of mode Vmode is entirely added to (or subtracted from) intermediate ground potentials VMa to VMc of power storage modules 2a to 2c. With use of mode Vmode, control circuit 16 corrects the reference range of intermediate ground potentials VMa to VMc. In other words, control circuit 16 adds mode Vmode to each of upper limit value Vup and lower limit value Vlo to calculate a corrected upper limit value (Vup+Vmode) and a corrected lower limit value (Vlo+Vmode).

Figure 13:
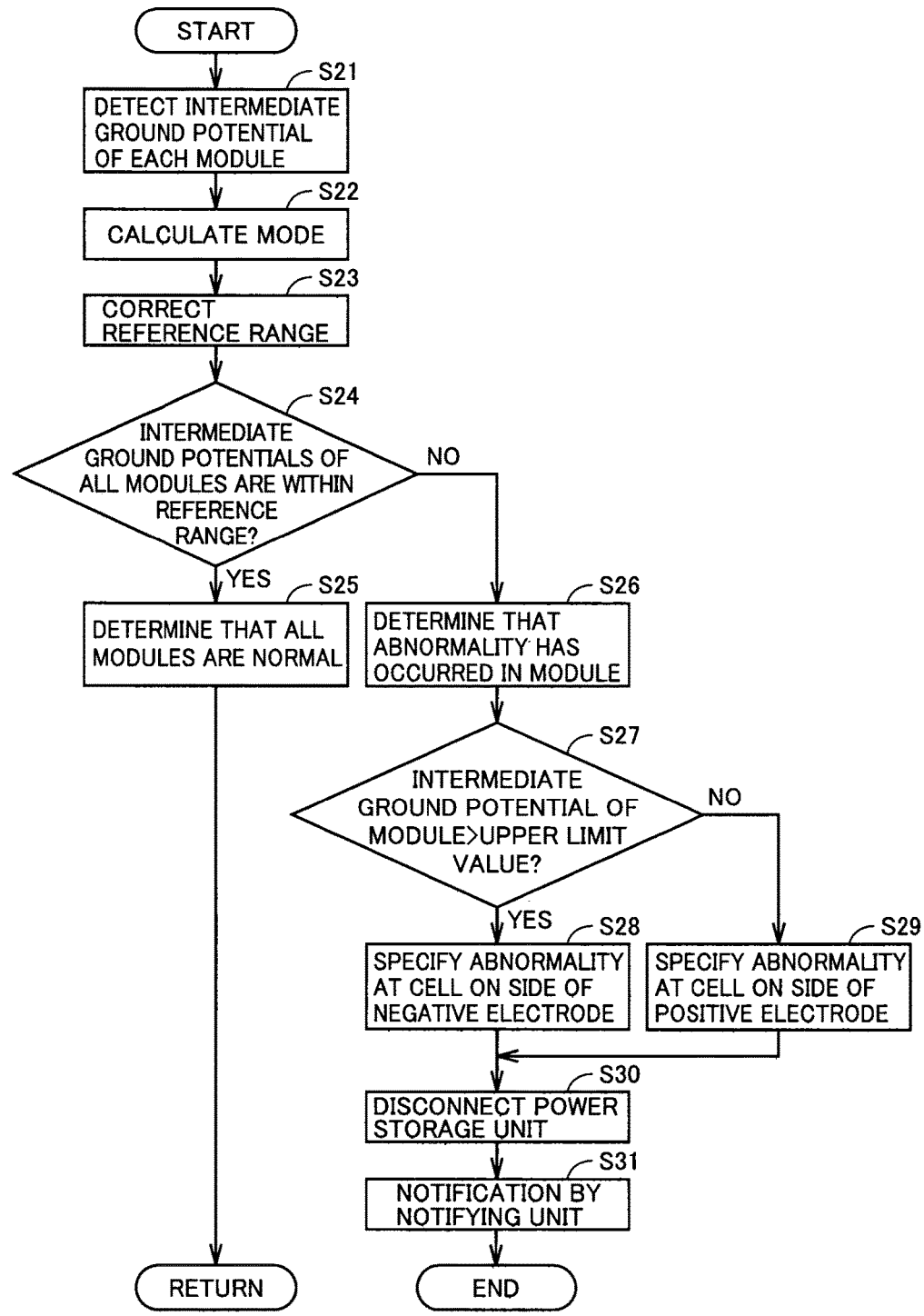
FIG. 13 is a flowchart for illustrating a control by the control unit shown in FIG. 11.

FIG. 13 is a flowchart for illustrating the determination by control circuit 16 shown in FIG. 11 and a control based on the determination. Referring to FIGS. 11 and 13, FIG. 13 is compared with FIG. 7. As one example, the processing is started at the time of starting operation of uninterruptable power supply device 52.

In Step S21, voltage detection units 8a to 8c respectively detect intermediate ground potentials VMa to VMc of power storage modules 2a to 2c, and output the detected values to control circuit 16. In Step S22, control circuit 16 calculates mode Vmode of intermediate ground potentials VMa to VMc. In Step S23, control circuit 16 corrects the reference range of intermediate ground potentials VMa to VMc with use of mode Vmode calculated in Step S22. More specifically, control circuit 16 adds mode Vmode to upper limit value Vup and lower limit value Vlo of the reference range.

In Step S24, control circuit 16 determines whether or not intermediate ground potentials VMa to VMc of power storage modules 2a to 2c are within the corrected reference range. When all of intermediate ground potentials VMa to VMc are within the corrected reference range (YES in Step S24), the processing proceeds to Step S25. When even one of intermediate ground potentials VMa to VMc is out of the corrected reference range (NO in Step S24), the processing proceeds to Step S26.

In Step S25, control circuit 16 determines that all of power storage modules 2a to 2c are normal. After that, the series of processing is repeated. On the other hand, in Step S26, control circuit 16 determines that an abnormality has occurred in a power storage module in which the intermediate ground potential is out of the corrected reference range. Since the processing of subsequent Steps S27 to S31 are the same as the processing of steps S15 to S19 in the flowchart shown in FIG. 6, detailed description will not be repeated.

Returning to FIGS. 12(A) and 12(B), each of intermediate ground potentials VMa to VMc may include a common offset component. A mode of intermediate ground potentials VMa to VMc corresponds to the above-described offset component. Before the correction of the reference range, intermediate ground potential VMc of power storage module 2c is higher than upper limit value Vup before correction due to an effect of the offset component. In this case, control circuit 16 incorrectly determines that an abnormality has occurred in power storage module 2c. To eliminate or reduce such effect of offset component, the reference range is corrected. After correcting the reference range, intermediate ground potential VMc of power storage module 2c becomes lower than corrected upper limit value (Vup+Vmode) and within the reference range. However, control circuit 16 can accurately determine that power storage module 2c is normal. As described above, according to the present embodiment, an accuracy in the determination of abnormality can be improved.

It should be noted that, according to the description above, control circuit 16 adds mode Vmode to upper limit value Vup and lower limit value Vlo of the reference range. In place of this, control circuit 16 may calculate a difference value of mode Vmode from each of intermediate ground potentials VMa to VMc. In other words, an abnormality may be determined based on whether or not each of intermediate ground potentials (VMa−Vmode), (VMb−Vmode), and (VMc−Vmode) is within the reference range defined by upper limit value Vup and lower limit value Vlo.

Moreover, detection of intermediate ground potentials VMa to VMc by voltage detection units 8a to 8c is preferably performed at same time. Accordingly, a noise component which is common in intermediate ground potentials VMa to VMc can be eliminated or reduced at the same time.

Third Embodiment

When a plurality of power storage modules are provided, intermediate ground potentials of the plurality of power storage modules may be compared. Since the configuration of the uninterruptable power supply device according to the third embodiment of the present invention is the same as the configuration of uninterruptable power supply device 52 according to the second embodiment shown in FIG. 11, detailed description will not be repeated.

Figure 14:
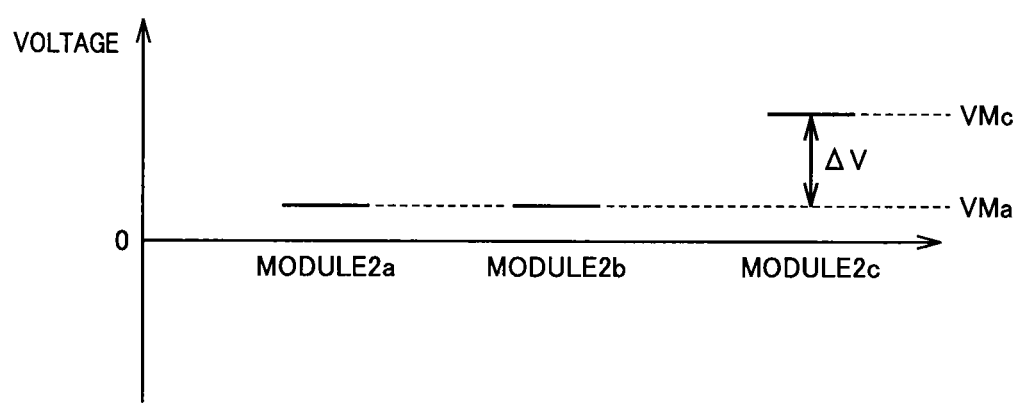
FIG. 14 is a diagram for illustrating a method for determining an abnormality in the power storage device shown in FIG. 11.

FIG. 14 is a diagram for illustrating a method for determining an abnormality in the uninterruptable power supply device according to the third embodiment of the present invention. Referring to FIGS. 9 and 14, similarly to the second embodiment also in the third embodiment, control circuit 16 calculates mode Vmode of intermediate ground potentials VMa to VMc of power storage modules 2a to 2c.

For power storage modules 2a, 2b having intermediate ground potentials which are equal to mode Vmode, control circuit 16 determines that these power storage modules are normal. On the other hand, for power storage module 2c indicating intermediate ground potential VMc which is different from the mode, control circuit 16 generates a difference value ΔVM between mode Vmode and intermediate ground potential VMc. Based on the difference value ΔVM, control circuit 16 determines whether or not power storage module 2c is normal. More specifically, when an absolute value of difference value ΔVM is greater than or equal to a predetermined reference value, control circuit 16 determines that an abnormality has occurred in power storage module 2c. On the other hand, when an absolute value of difference value ΔVM is less than the reference value, control circuit 16 determines that power storage module 2c is normal.

It should be noted that the case was described where three power storage modules 2a to 2c are provided in uninterruptable power supply device 52. However, the present invention can be applied to the case where only two power storage modules 2a, 2b are provided. In this case, control circuit 16 calculates a difference value of intermediate ground potentials VMa, VMb respectively from power storage modules 2a, 2b. When an absolute value of a difference value is greater than or equal to a predetermined reference value, control circuit 16 determines that an abnormality has occurred in any one of power storage modules 2a, 2b. On the other hand, when an absolute value of difference value ΔVM is less than a reference value, control circuit 16 determines that power storage modules 2a, 2b are normal.

Also in the third embodiment, similarly to the second embodiment, a detection error due to an offset component of intermediate ground potentials VMa to VMc can be reduced. Moreover, by performing detection of intermediate ground potentials VMa to VMc by voltage detection unit 8a to 8c at the same time, the effect of a noise component can be eliminated or reduced. Thus, an accuracy in determination of an abnormality can be improved.

It should be noted that, in the first and second embodiments, the uninterruptable power supply device of a normal inverter feed system was described. However, the "power storage device" according to the present invention is not particularly limited as long as it is a power storage device including a plurality of cells connected in series. The "power storage device" according to the present invention may be, for example, an uninterruptable power supply device of a normal commercial power feed system.

It should be understood that the embodiments disclosed herein are only by way of examples, and not to be taken by way of limitation. The technical scope of the present invention is not limited by the description above, but rather by the terms of the appended claims. Further, any modifications within the scope and meaning equivalent to the terms of the claims are included.

REFERENCE SIGNS LIST 100 power storage system; 200 abnormality detection circuit; 1, 1a, 13 cell; 2, 15, 2a to 2b power storage module; 2a to 2b module; 3, 31 power storage unit; 14 balance resistor; 4 converter; 5, 51, 52 uninterruptable power supply device; 6 insulated transformer; 7 alternating current power supply; 8 voltage detection circuit; 8a to 8c voltage detection unit; 81, 81a to 81c voltage measuring instrument; 82, 82a to 82c grounding resistance; 16 control circuit; 17 inverter; 18 load; 19 switch; 20 notifying unit; T1 positive electrode terminal; T2 negative electrode terminal.

The invention claimed is:

1. An abnormality detection circuit configured to detect an abnormality of a power storage device,
said power storage device including:
a converter configured to convert alternating current power supplied from an alternating current power supply into direct current power and output a positive electrical potential and a negative electrical potential having absolute values equal to each other;
a power storage unit configured to store direct current power generated by said converter; and
an inverter configured to convert direct current power from said converter and direct current power stored in said power storage unit into alternating current power and supply the alternating current power to a load,
said power storage unit including:
a positive electrode terminal and a negative electrode terminal respectively receiving said positive electrical potential and said negative electrical potential from said converter; and
a power storage module connected between said positive electrode terminal and said negative electrode terminal,
said power storage module having a plurality of cells connected in series between said positive electrode terminal and said negative electrode terminal,
said abnormality detection circuit including:
a voltage detection circuit configured to detect an electrical potential of an intermediate node located at an intermediate position between said positive electrode terminal and said negative electrode terminal on a basis of a ground potential, said intermediate node being a node between two cells located at an intermediate position between said positive electrode terminal and said negative electrode terminal among said plurality of cells; and
a control circuit configured to determine said abnormality of said power storage module based on a change in a detection value of said voltage detection circuit from said ground potential, said control circuit determining that said power storage module is abnormal when said detection value is out of a predetermined reference range defined by an upper limit value higher than said ground potential and a lower limit value lower than said ground potential value, said control circuit specifying said abnormality occurring at a location between said negative electrode terminal and said intermediate node when said detection value is higher than said upper limit value, said control circuit specifying said abnormality occurring at a location between said positive electrode terminal and said intermediate node when said detection value is lower than said lower limit value.

2. The abnormality detection circuit according to claim 1, wherein said abnormality of said power storage module is at least one of ground fault and an increase in an internal resistance value at any cell among the plurality of cells.

3. The abnormality detection circuit according to claim 1, wherein
said power storage module includes first to n-th (n is a natural number greater than or equal to 3) modules, said voltage detection circuit includes first to n-th voltage detection units provided so as to correspond respectively to said first to n-th modules, and said control circuit calculates a mode of respective first to n-th detection values from said first to n-th voltage detection units and corrects said upper limit value and said lower limit value based on said mode.

4. A power storage device comprising:
said converter;
said power storage unit;
said inverter; and
the abnormality detection circuit according to claim 1.

5. The power storage device according to claim 4, wherein said power storage device further comprises a breaking unit which is provided between a connection point of said converter with said inverter and said power storage unit and is shifted from a conductive state to a non-conductive state in response to a breaking signal, and said control circuit outputs said breaking signal to said breaking unit when said power storage module is determined as being abnormal.

6. The power storage device according to claim 4, wherein said power storage device further comprises a notifying unit configured to notify an abnormality to a user, and said control circuit controls said notifying unit so as to notify said abnormality when said power storage module is determined as being abnormal.

7. The power storage device according to claim 4, wherein said power storage unit is either a storage battery or a capacitor.

8. An abnormality detection circuit configured to detect an abnormality of a power storage device,
said power storage device including:
a converter configured to convert alternating current power supplied from an alternating current power supply into direct current power and output a positive electrical potential and a negative electrical potential having absolute values equal to each other;
a power storage unit configured to store direct current power generated by said converter; and
an inverter configured to convert direct current power from said converter and direct current power stored in said power storage unit into alternating current power and supply the alternating current power to a load,
said power storage unit including
a positive electrode terminal and a negative electrode terminal respectively receiving said positive electrical potential and said negative electrical potential from said converter; and
a power storage module connected between said positive electrode terminal and said negative electrode terminal, said power storage module having a plurality of cells connected in series between said positive electrode terminal and said negative electrode terminal, said power storage module including first to n-th (n is a natural number greater than or equal to 2) modules,
a voltage detection circuit configured to detect an electrical potential of an intermediate node located at an intermediate position between said positive electrode terminal and said negative electrode terminal on a basis of a ground potential, said intermediate node being a node between two cells located at an intermediate position between said positive electrode terminal and said negative electrode terminal among said plurality of cells, said voltage detection circuit including first to n-th voltage detection units provided so as to correspond respectively to said first to n-th modules; and a control circuit configured to determine said abnormality of said power storage module based on a change in a detection value of said voltage detection circuit from said around potential, said control circuit correcting a predetermined reference range using an offset component of said intermediate node calculated from first to n-th detection values from said first to n-th voltage detection units and determining that said power storage module is abnormal when at least one of said first to n-th detection values is out of said reference range.

9. An abnormality detection circuit configured to detect an abnormality of a power storage device,
said power storage device including:
a converter configured to convert alternating current power supplied from an alternating current power supply into direct current power and output a positive electrical potential and a negative electrical potential having absolute values equal to each other;
a power storage unit configured to store direct current power generated by said converter; and
an inverter configured to convert direct current power from said converter and direct current power stored in said power storage unit into alternating current power and supply the alternating current power to a load,
said power storage unit including:
a positive electrode terminal and a negative electrode terminal respectively receiving said positive electrical potential and said negative electrical potential from said converter; and
a power storage module connected between said positive electrode terminal and said negative electrode terminal, said power storage module having a plurality of cells connected in series between said positive electrode terminal and said negative electrode terminal, said power storage module including first to n-th (n is a natural number greater than or equal to 3) modules,
a voltage detection circuit configured to detect an electrical potential of an intermediate node located at an intermediate position between said positive electrode terminal and said negative electrode terminal on a basis of a ground potential, said intermediate node being a node between two cells located at an intermediate position between said positive electrode terminal and said negative electrode terminal among said plurality of cells, said voltage detection circuit including first to n-th voltage detection units provided so as to correspond respectively to said first to n-th modules, and a control circuit configured to determine said abnormality of said power storage module based on a change in a detection value of said voltage detection circuit from said around potential, said control circuit calculating a mode of respective first to n-th detection values from said first to n-th voltage detection units, calculating first to n-th difference values between said first to n-th detection values and said mode, and determining that said power storage module is abnormal when at least one of absolute values of said first to n-th difference values is higher than a predetermined reference value.

* * * * *